(12) United States Patent
Luo

(10) Patent No.: US 11,271,176 B2
(45) Date of Patent: Mar. 8, 2022

(54) THERMALLY ACTIVATED DELAYED FLUORESCENT MATERIAL, METHOD OF FABRICATING SAME, AND ELECTROLUMINESCENT DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jiajia Luo, Wuhan (CN)

( * ) Notice: Subject to any disclaimer, the term of this patent is extended or adjusted under 35 U.S.C. 154(b) by 495 days.

(21) Appl. No.: 16/463,043

(22) PCT Filed: Mar. 19, 2019

(86) PCT No.: PCT/CN2019/078591
§ 371 (c)(1),
(2) Date: May 22, 2019

(87) PCT Pub. No.: WO2020/124827
PCT Pub. Date: Jun. 25, 2020

(65) Prior Publication Data
US 2021/0359208 A1    Nov. 18, 2021

(30) Foreign Application Priority Data

Dec. 19, 2018   (CN) .......................... 201811559197.7

(51) Int. Cl.
*H01L 51/50*    (2006.01)
*H01L 51/00*    (2006.01)
(Continued)

(52) U.S. Cl.
CPC ............ *H01L 51/008* (2013.01); *C07F 5/027* (2013.01); *C07F 9/6584* (2013.01); *C09K 11/06* (2013.01);
(Continued)

(58) Field of Classification Search
CPC . H01L 51/00; H01L 51/50; C07F 5/02; C07F 9/6584
See application file for complete search history.

(56) References Cited

U.S. PATENT DOCUMENTS

2018/0069182 A1   3/2018  Hatakeyama et al.
2019/0115537 A1   4/2019  Makishima et al.
(Continued)

FOREIGN PATENT DOCUMENTS

CN    107266484 A    10/2017
CN    107793441 A    3/2018
(Continued)

OTHER PUBLICATIONS

Nakatsuka, S., Gotoh, H., Kinoshita, K., Yasuda, N. and Hatakeyama, T., 2017. Divergent Synthesis of Heteroatom-Centered 4, 8, 12-Triazatriangulenes. Angewandte Chemie International Edition, 56(18), pp. 5087-5090. (Abstract Only).

*Primary Examiner* — Dung A. Le
(74) *Attorney, Agent, or Firm* — JMB Davis Ben-David

(57) ABSTRACT

A thermally activated delayed fluorescent material, a method of fabricating the same, and an electroluminescent device are provided. An electron donor and an electron acceptor of the thermally activated delayed fluorescent material are connected with each other by a hexatomic ring. Thus, luminous efficiency of the thermally activated delayed fluorescent material can be improved.

8 Claims, 5 Drawing Sheets

(51) Int. Cl.
*C07F 5/02* (2006.01)
*C07F 9/6584* (2006.01)
*C09K 11/06* (2006.01)

(52) U.S. Cl.
CPC .. H01L 51/0071 (2013.01); *C09K 2211/1018* (2013.01); *H01L 51/5012* (2013.01); *H01L 51/5056* (2013.01); *H01L 51/5072* (2013.01)

(56) References Cited

U.S. PATENT DOCUMENTS

2020/0176692 A1* 6/2020 Watabe .................... F21S 2/00
2020/0235312 A1* 7/2020 Sugioka .................. H01L 27/32

FOREIGN PATENT DOCUMENTS

| | | |
|---|---|---|
| CN | 109155370 A | 1/2019 |
| JP | 2017126606 A | 7/2017 |

* cited by examiner

S101

Adding oxytetrahydrofuran, n-butyllithium, and a solution of boron bromide in diethyl ether in sequence into 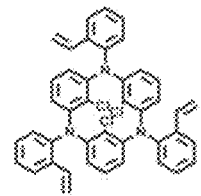 to react in a predetermined temperature range so as to obtain a first reaction solution

S102

Purifying the first reaction solution to obtain a first solid

S103

Performing a catalytic reaction to the first solid in methane using a palladium carbon catalyst to obtain a second reaction solution

S104

Filtering the second reaction solution to obtain the thermally activated delayed fluorescent material

Adding oxytetrahydrofuran, n-butyllithium, and a solution of boron bromide in diethyl etherin sequence into 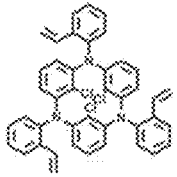 to react in a predetermined temperature range so as to obtain a first reaction solution

S202

Adding a reactant into the first reaction solution to obtain a third reaction solution

S203

Purifying the third reaction solution to obtain a third solid

S204

Performing a catalytic reaction to the third solid in methane using a palladium carbon catalyst to obtain a fourth reaction solution

S205

Filtering the fourth reaction solution to obtain the thermally activated delayed fluorescent material

FIG. 2

HOMO  LOMO

HOMO  LOMO

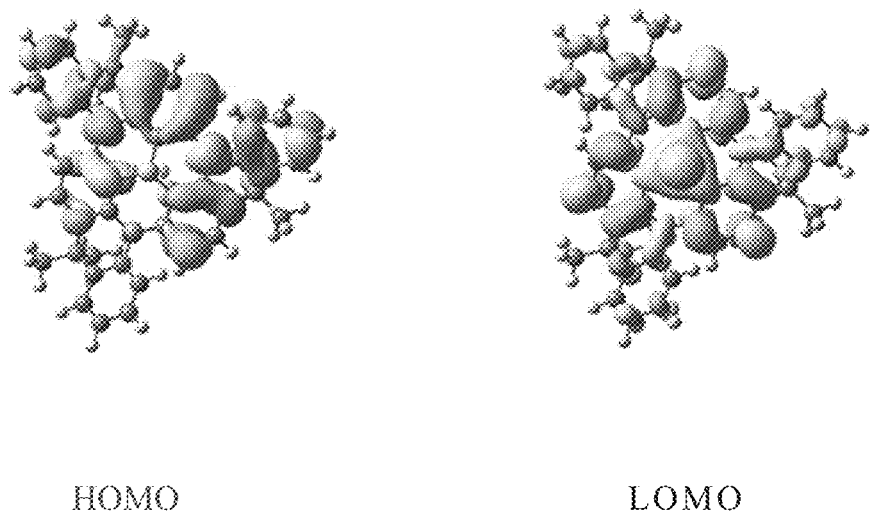
HOMO    LOMO
FIG. 7
FIG. 8

THERMALLY ACTIVATED DELAYED FLUORESCENT MATERIAL, METHOD OF FABRICATING SAME, AND ELECTROLUMINESCENT DEVICE

CROSS-REFERENCE TO RELATED APPLICATIONS

This is the US National Stage of International Patent Application No. PCT/CN2019/078591, filed Mar. 19, 2019, which claims the benefit of Chinese Patent Application No. 201811559197.7, filed Dec. 19, 2018.

FIELD OF DISCLOSURE

The present disclosure relates to displays, and more particularly, to a thermally activated delayed fluorescent material, a method of fabricating the same, and an electroluminescent device.

BACKGROUND OF DISCLOSURE

Organic light emitting diodes (OLEDs) have advantages of self-illumination, fast response times, wide viewing angles, and flexible display, and are dominant in the display field.

A luminescent layer is disposed in the OLED. The luminescent layer is made of a luminescent material having luminescent properties, such as a fluorescent material, a phosphorescent material, and a thermally activated delayed fluorescence (TADF) material.

An electron donor and an electron acceptor in the TADF material are connected by a single bond, wherein the single bond is easy to rotate so as to induce an excessively broad spectrum of the TADF material.

SUMMARY OF DISCLOSURE

An object of the present disclosure is to provide a thermally activated delayed fluorescent material, a method of fabricating the same, and an electroluminescent device, which improves luminous efficiency of the thermally activated delayed fluorescent material.

An embodiment of the present disclosure provides a thermally activated delayed fluorescent material, comprising a molecular structural formula of

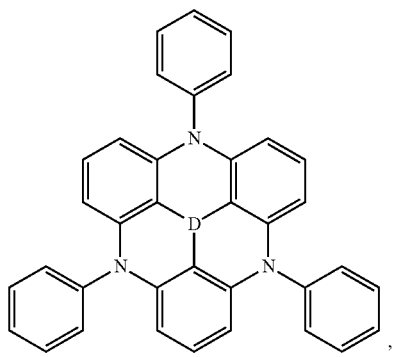

and an electron donor and an electron acceptor of the thermally activated delayed fluorescent material are connected with each other by a hexatomic ring, wherein D is the electron acceptor and is

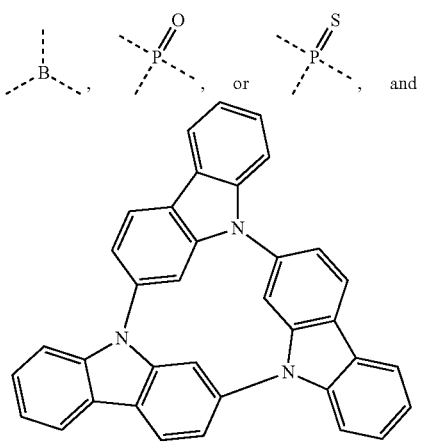

is the electron donor.

In an embodiment, a molecular structural formula of the thermally activated delayed fluorescent material is

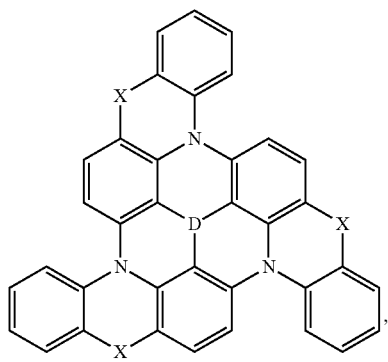

and an electron donor and an electron acceptor of the thermally activated delayed fluorescent material are connected with each other by a hexatomic ring, wherein D is the electron acceptor and is

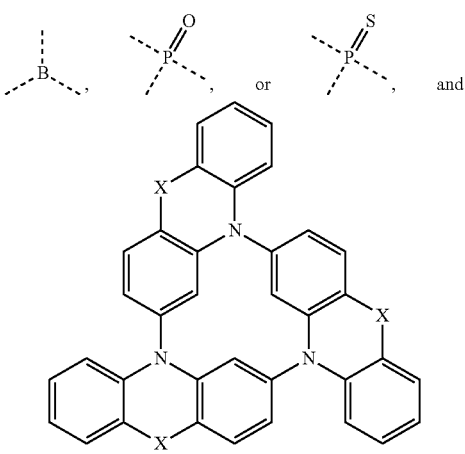

is the electron donor, and X is $C(CH_3)_2$, 2H, S, or O.

An embodiment of the present disclosure further provides a method of fabricating a thermally activated delayed fluorescent material, comprising steps of:

adding oxytetrahydrofuran, n-butyllithium, and a solution of boron bromide in diethyl ether in sequence into

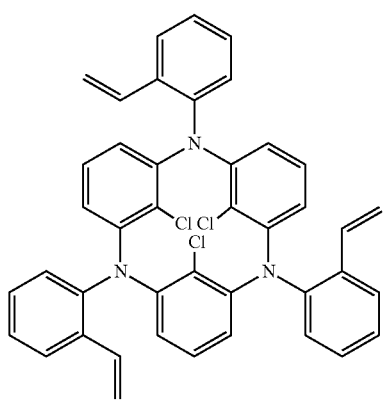 [SMILES: C=Cc1ccccc1N1c2cccc(c2Cl)N(c2ccccc2C=C)c2cccc(c2Cl)N(c2ccccc2C=C)c2cccc1c2Cl]

to react in a predetermined temperature range so as to obtain a first reaction solution;

purifying the first reaction solution to obtain a first solid;

performing a catalytic reaction to the first solid in methane using a palladium carbon catalyst to obtain a second reaction solution; and filtering the second reaction solution to obtain the thermally activated delayed fluorescent material.

In an embodiment, the step of purifying the first reaction solution to obtain the first solid comprises steps of:

mixing the first reaction solution with water in the predetermined temperature range to obtain the second solid; and dissolving the second solid in dichloromethane to obtain a mixture, and adding silica gel and toluene into the mixture for purifying so as to obtain the first solid.

In an embodiment, the first solid is

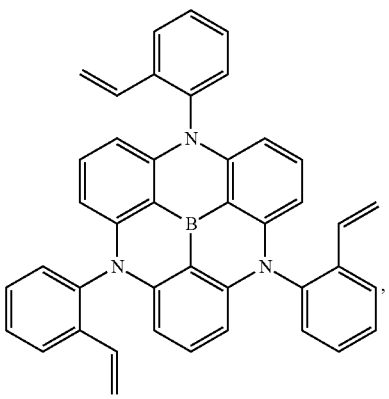 [SMILES: C=Cc1ccccc1N1c2cccc3c2B2c4c1cccc4N(c1ccccc1C=C)c1cccc(c12)N3c1ccccc1C=C]

and the thermally activated delayed fluorescent material is

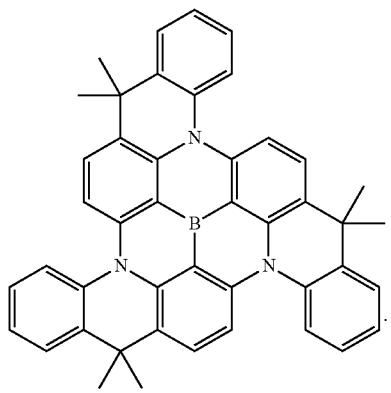

In an embodiment, the predetermined temperature range is between −75° C. and −80° C.

An embodiment of the present disclosure further provides a method of fabricating a thermally activated delayed fluorescent material, comprising steps of:

adding oxytetrahydrofuran, n-butyllithium, and a solution of boron bromide in diethyl ether in sequence into

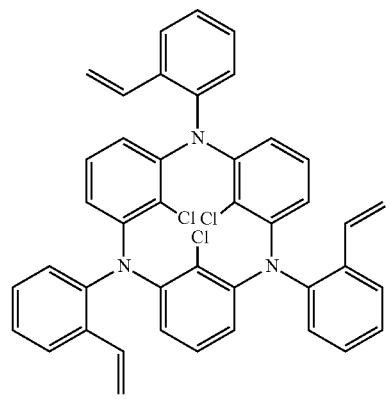 [SMILES: C=Cc1ccccc1N1c2cccc(c2Cl)N(c2ccccc2C=C)c2cccc(c2Cl)N(c2ccccc2C=C)c2cccc1c2Cl]

to react in a predetermined temperature range so as to obtain a first reaction solution;

adding a reactant into the first reaction solution to obtain a third reaction solution;

purifying the third reaction solution to obtain a third solid;

performing a catalytic reaction to the third solid in methane using a palladium carbon catalyst to obtain a fourth reaction solution; and filtering the fourth reaction solution to obtain the thermally activated delayed fluorescent material.

In an embodiment, the reactant is meta-Chloroperoxybenzoic acid, the third solid is

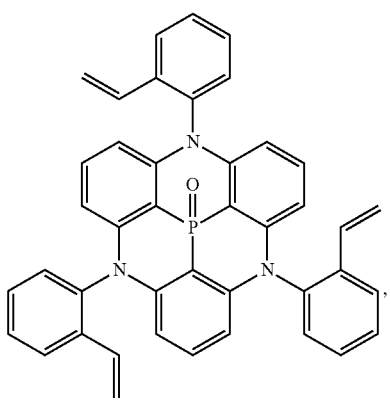

and the thermally activated delayed fluorescent material is

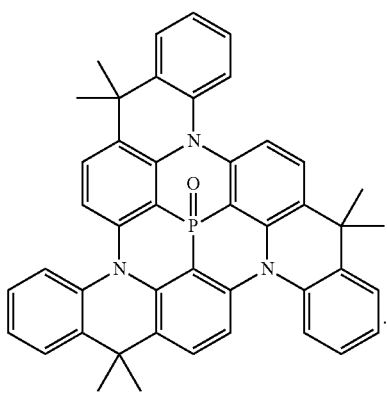

In an embodiment, the reactant is sulfur powder, the third solid is

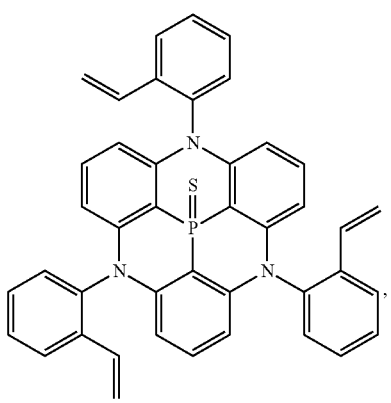

and the thermally activated delayed fluorescent material is

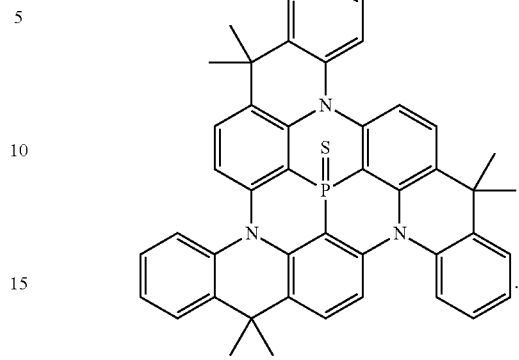

In an embodiment, the predetermined temperature range is between −75° C. and −80° C.

An embodiment of the present disclosure further provides an electroluminescent device, comprising: a substrate layer; an anode layer, a hole transporting layer, a luminescent layer, an electron transporting layer, and a cathode layer disposed in sequence, wherein the anode layer is used to provide holes;
wherein the hole transporting layer is used to transport the holes to the luminescent layer;
wherein the cathode layer is used to provide electrons;
wherein the electron transporting layer is used to transport the electrons to the luminescent layer;
wherein the luminescent layer comprises the thermally activated delayed fluorescent material described above; and
wherein the luminescent layer is used to recombine the holes and the electrons to generate excitons, and cause the thermally activated delayed fluorescent material to emit light under an effect of the excitons.

In a thermally activated delayed fluorescent material, a method of fabricating the same, and an electroluminescent device in an embodiment of the present disclosure, the electron donor and the electron acceptor are connected with each other by a hexatomic ring, so as to improve a luminous efficiency.

DESCRIPTION OF DRAWINGS

To make the above description of the present disclosure more clearly comprehensible, it is described in detail below in examples of preferred embodiments with the accompanying drawings.

FIG. 1 is a flowchart of a method of fabricating a thermally activated delayed fluorescent material according to an embodiment of the present disclosure.

FIG. 2 is another flowchart of a method of fabricating a thermally activated delayed fluorescent material according to an embodiment of the present disclosure.

FIG. 7 is a distribution diagram of HOMO and LUMO of a further thermally activated delayed fluorescent material according to an embodiment of the present disclosure.

FIG. 8 is a schematic structural diagram of an electroluminescent device according to an embodiment of the present disclosure.

DETAILED DESCRIPTION OF PREFERRED EMBODIMENTS

Figure 3:
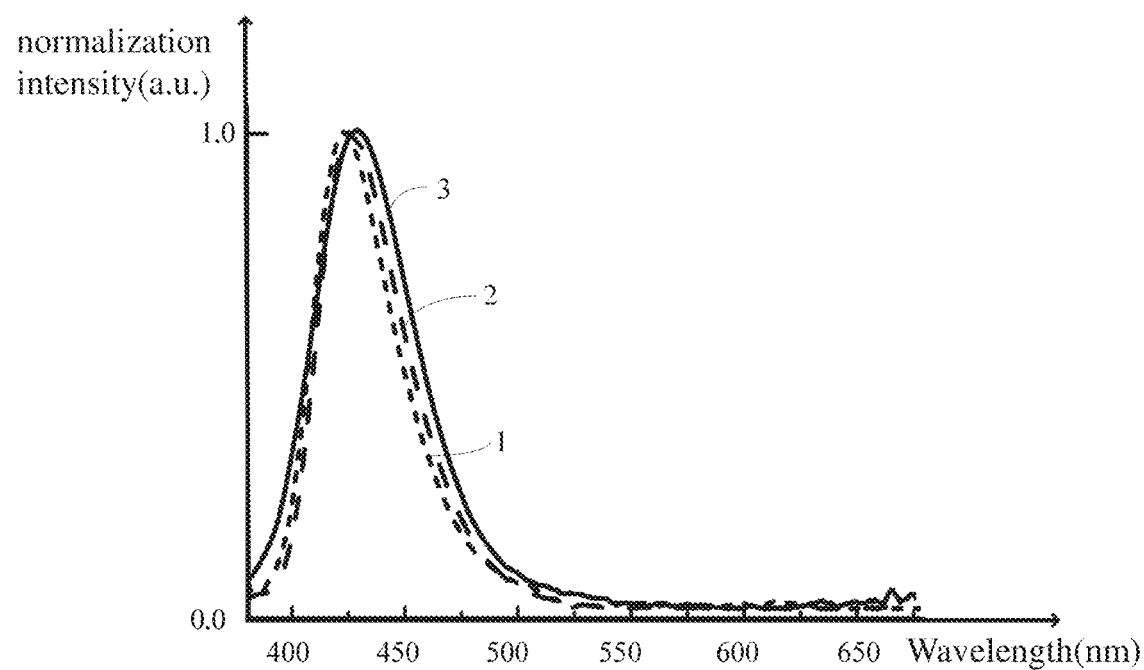
FIG. 3 is a photoluminescence spectrum of a thermally activated delayed fluorescent material in a toluene solution according to an embodiment of the present disclosure.

Following description of the various embodiments is provided with the accompanying drawings to illustrate the specific embodiments of the present disclosure. Furthermore, directional terms mentioned in the present disclosure, such as upper, lower, front, rear, left, right, inner, outer, side, etc., only refer to a direction of the accompanying figures. Therefore, the used directional terms are used to describe and understand the present disclosure, but the present disclosure is not limited thereto.

In the drawings, structurally similar elements are denoted by the same reference numerals.

References to "an embodiment" herein mean that a particular feature, structure, or characteristic described in connection with the embodiments can be included in at least one embodiment of the disclosure. The appearances of the phrases in various places in the specification are not necessarily referring to the same embodiments, and are not exclusive or alternative embodiments that are mutually exclusive. Those skilled in the art will explicitly understand and implicitly understand that the embodiments described herein can be combined with other embodiments.

An embodiment of the present disclosure provides a thermally activated delayed fluorescent material, comprising a molecular structural formula of

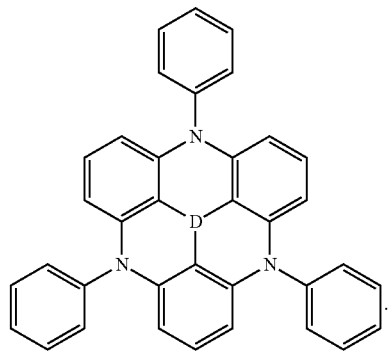

An electron donor of

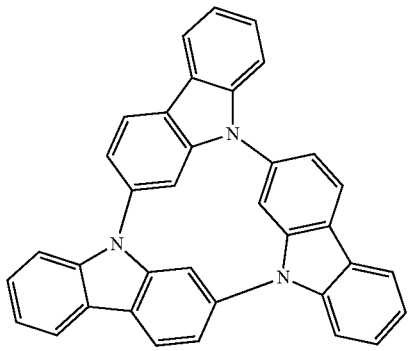 [SMILES: c1ccc2c(c1)c1ccc3cc1n2c1ccc2c4ccccc4n(c4ccc5c6ccccc6n3c5c4)c2c1]

and an electron acceptor D of the thermally activated delayed fluorescent material are connected with each other by a hexatomic ring. The electron donor refers to a substance that supplies electrons in electron transfer and a substance that is oxidized. An electron acceptor refers to a substance that accepts the electrons in electron transport and a substance that is reduced.

In an embodiment, D is

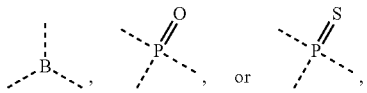

i.e., the thermally activated delayed fluorescent material comprises

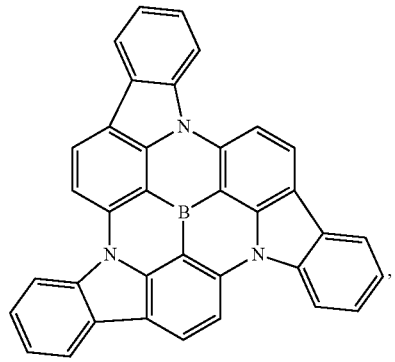

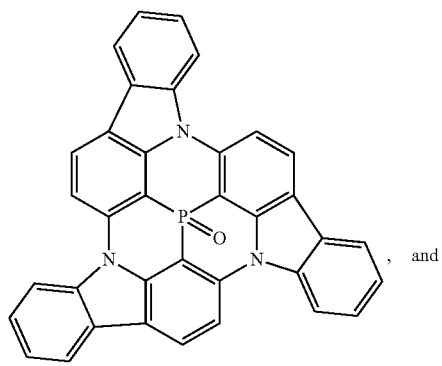

, and

-continued

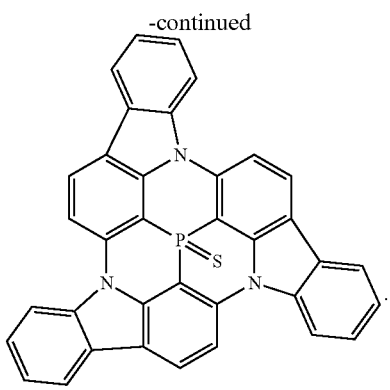

An embodiment of the present disclosure further provides a thermally activated delayed fluorescent material. A molecular structural formula of the thermally activated delayed fluorescent material is

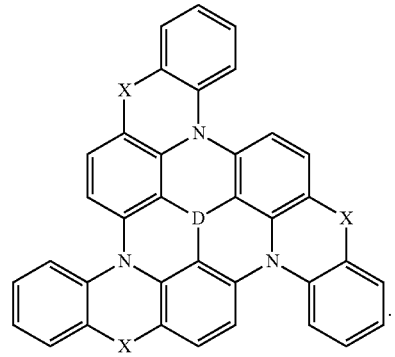

An electron donor of

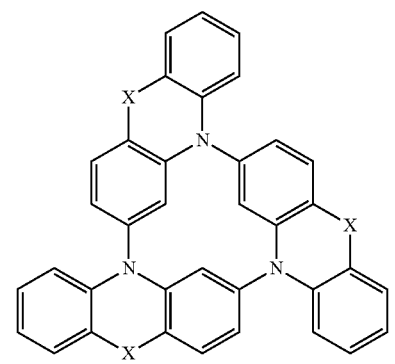

and an electron acceptor D of the thermally activated delayed fluorescent material are connected with each other by a hexatomic ring.

In an embodiment, D is

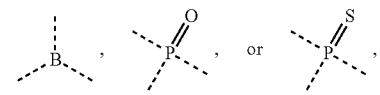

and X is $C(CH_3)_2$, 2H, S, or O, i.e., the thermally activated delayed fluorescent material includes

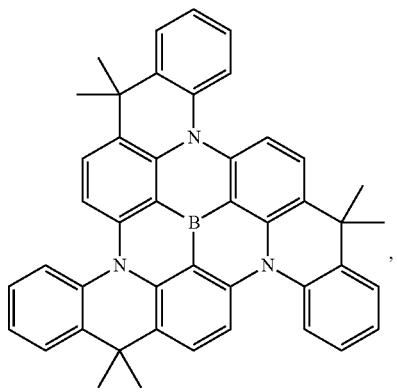

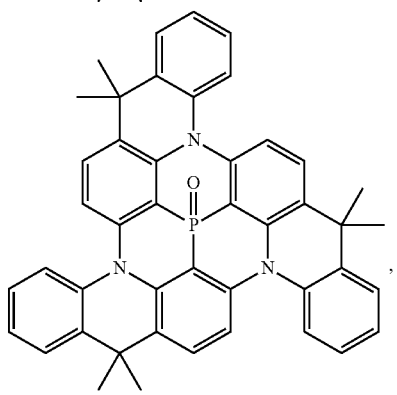

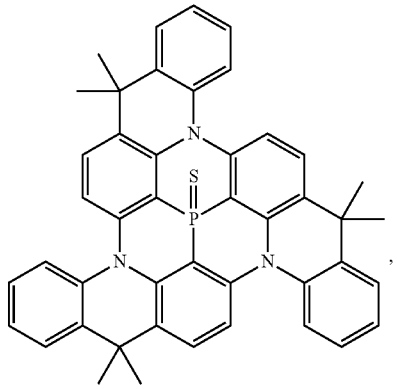

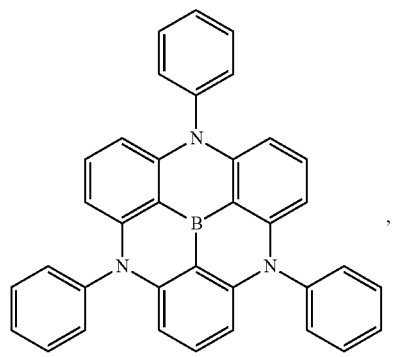

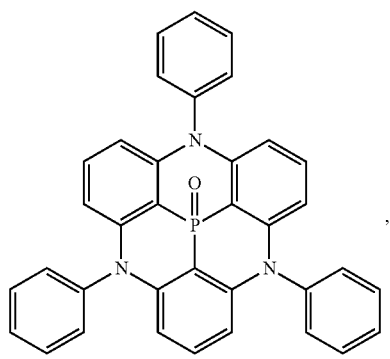

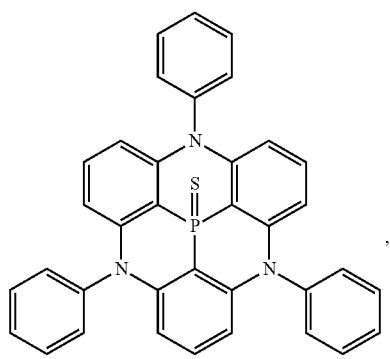

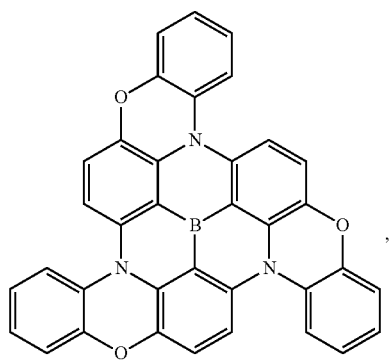

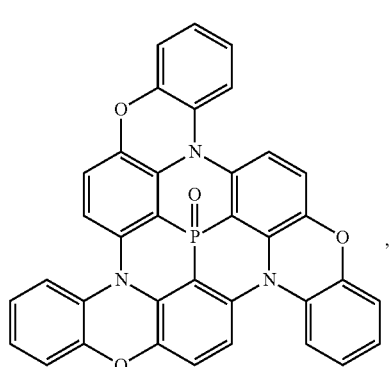

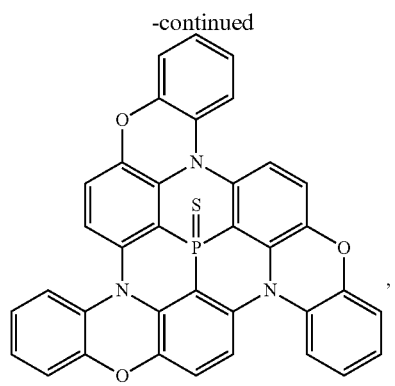

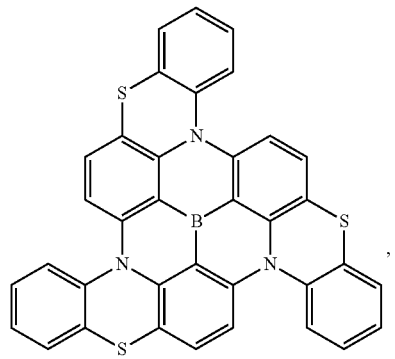

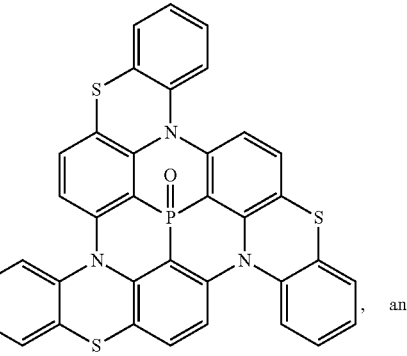

, and

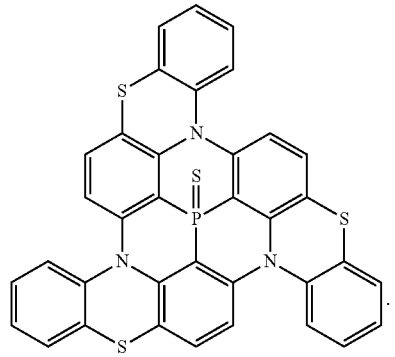

An electron donor and an electron acceptor in existing thermally activated delayed fluorescent materials are bonded by a single bond. The single-bond connection has poor stability and is easy to rotate, resulting in an excessively broad spectrum of the existing thermally activated delayed fluorescent material. In an embodiment of the present disclosure, the rigid hexatomic ring is used to connect the electron donor with the electron acceptor, and a spectral width of the thermally activated delayed fluorescent material can be effectively controlled, and luminous efficiency of the thermally activated delayed fluorescent material can be improved.

The thermally activated delayed fluorescent material of an embodiment of the present disclosure connects the electron donor with the electron acceptor through a hexatomic ring, effectively controls the spectral width of the thermally activated delayed fluorescent material, and improves the luminous efficiency of the thermally activated delayed fluorescent material.

An embodiment of the present disclosure further provides a method of fabricating a thermally activated delayed fluorescent material, and the fabricating method is used to fabricate the above thermally activated delayed fluorescent material. Referring to FIG. 1, FIG. 1 is a flowchart of a method of fabricating a thermally activated delayed fluorescent material according to an embodiment of the present disclosure. The fabricating method comprises steps as follows.

In step S101, oxytetrahydrofuran, n-butyllithium, and a solution of boron bromide in diethyl ether are added in sequence into

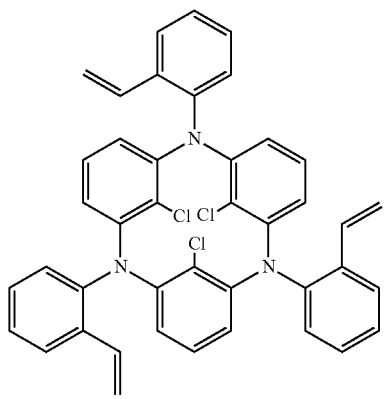 [SMILES: C=Cc1ccccc1N1c2cccc(c2Cl)N(c2ccccc2C=C)c2cccc(c2Cl)N(c2ccccc2C=C)c2cccc1c2Cl]

to react in a predetermined temperature range so as to obtain a first reaction solution.

The predetermined temperature range is between −75° C. and −80° C. In an embodiment, it can be set to −78° C. Specifically, at first,

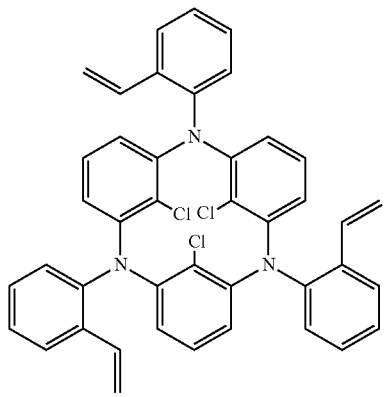 [SMILES: C=Cc1ccccc1N1c2cccc(c2Cl)N(c2ccccc2C=C)c2cccc(c2Cl)N(c2ccccc2C=C)c2cccc1c2Cl]

(6.85 g, 10 mmol) is added to a 100 ml two-necked flask and pumped three times. Further, 60 ml of oxytetrahydrofuran (THF) with water-free and oxygen-free is added thereto. Then, 15 ml of n-butyllithium (n-BuLi) having a molar concentration of 2 mol/L is added, and the reaction is carried out for 2 hours at a predetermined temperature range. Finally, 5 ml of a solution of boron bromide (BBr$_3$) in diethyl ether in a molar ratio of 2 mol/L is added thereto, and is reacted for 2 hours in the predetermined temperature range to obtain the first reaction solution.

In step S102, the first reaction solution is purified to obtain a first solid.

In an embodiment, a step of purifying the first reaction solution to obtain the first solid comprises following steps.

In step A1, the first reaction solution is mixed with water in the predetermined temperature range to obtain the second solid.

In step A2, the second solid is dissolved in dichloromethane to obtain a mixture, and adding silica gel and toluene into the mixture for purifying so as to obtain the first solid.

Specifically, after the first reaction solution is naturally warmed to room temperature, it is poured into 200 ml of water in a predetermined temperature range to precipitate a second solid. In an embodiment, the water in the predetermined temperature range can be water below 0° C. to increase an amount of precipitation of the second solid.

Further, suction filtration is performed to a mixed solution of the first reaction solution and water to obtain a second solid, wherein the second solid is a grey-white solid.

Finally, column chromatography separation and purifying are performed by dissolving the second solid in dichloromethane and then adding silica gel and toluene thereto, so as to obtain 3.6 g of the first solid

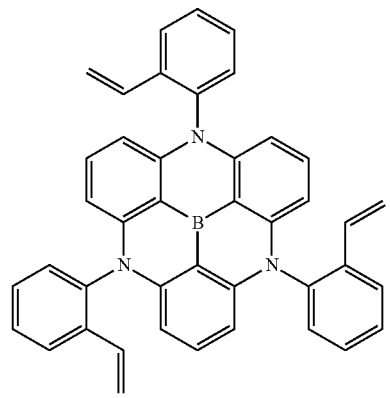 [SMILES: C=Cc1ccccc1N1c2cccc3c2B2c4c1cccc4N(c1ccccc1C=C)c1cccc(c12)N3c1ccccc1C=C]

having a yield of 61%. A nuclear magnetic resonance spectrum of the first solid

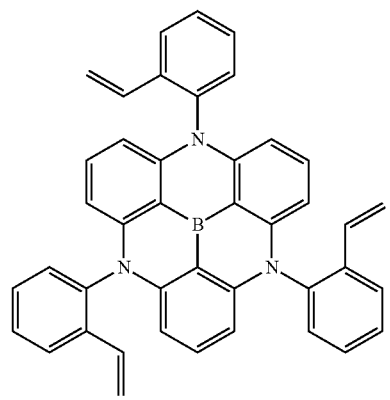 [SMILES: C=Cc1ccccc1N1c2cccc3c2B2c4c1cccc4N(c1ccccc1C=C)c1cccc(c12)N3c1ccccc1C=C]

is characterized by $^1$H NMR (300 MHz, CD$_2$Cl$_2$, δ): 7.37 (d, J=6.3 Hz, 3H), 7.30-7.17 (m, 9H), 7.13-7.03 (m, 6H), 6.84

(d, J=6.6 Hz, 6H), 5.72 (d, J=6.0 Hz, 3H), 5.60 (d, J=6.0 Hz, 3H), and a mass spectrometry is characterized by MS (EI) m/z: [M Calc for $C_{42}H_{30}BN_3$: C 85.86, H 5.15, N 7.15; found: C 85.76, H 5.07, N 7.09. It is noted that, a volume ratio of toluene to methylene chloride can be set to 1:2. 200-300 mesh powdery silica gel particles can be added as a stationary phase, and the second solid is dispersed in the silica gel to facilitate subsequent column chromatography separation.

In step S103, a catalytic reaction is performed to the first solid in methane using a palladium carbon catalyst to obtain a second reaction solution.

Specifically, the first solid is added to a 100 ml reactor, and then a catalyst of palladium carbon is added thereto. A reaction is carried out for 2 hours at room temperature under a methane atmosphere to obtain a second reaction solution.

In step S104, the second reaction solution is filtered to obtain the thermally activated delayed fluorescent material.

Specifically, the above second reaction solution is poured into 50 ml of water below 0° C., and a compound in the aqueous phase is extracted three times with dichloromethane, and the dichloromethanes extracted three-times are combined. Further, column chromatography separation and purifying are performed by adding silica gel and toluene to obtain a thermally activated delayed fluorescent material.

1.8 g of blue-white powdered thermally activated delayed fluorescent material

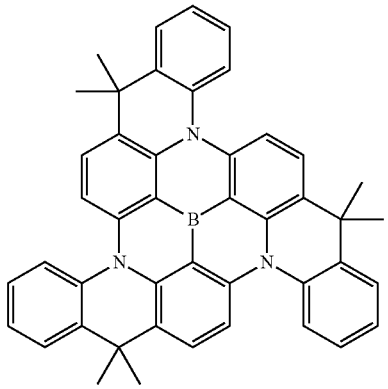 [SMILES: CC1(C)c2ccccc2N2c3ccc4c5c3B3c6c(ccc1c62)N1c2ccccc2C(C)(C)c2ccc(c3c21)N5c1ccccc1C4(C)C]

can be obtained, which has a yield of 72%. A nuclear magnetic resonance spectrum of the thermally activated delayed fluorescent material

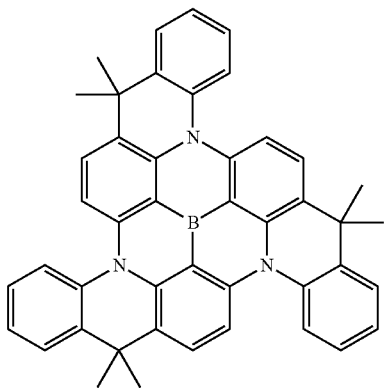 [SMILES: CC1(C)c2ccccc2N2c3ccc4c5c3B3c6c(ccc1c62)N1c2ccccc2C(C)(C)c2ccc(c3c21)N5c1ccccc1C4(C)C]

is characterized by 1H NMR (300 MHz, $CD_2Cl_2$, δ): 7.43 (d, J=6.0 Hz, 3H), 7.27 (d, J=6.3 Hz, 3H), 7.17-7.03 (m, 6H), 6.84 (d, J=6.6 Hz, 6H), 1.59 (s, 18H). A mass spectrometry is characterized by MS (EI) m/z: [M]+ calcd for $C_{45}H_{36}BN_3$, 629.30; found, 629.21. Anal. Calcd for $C_{45}H_{36}BN_3$: C 85.85, H 5.76, N 6.67; found: C 85.76, H 5.67, N 6.59.

The electron acceptor of the thermally activated delayed fluorescent material is

and an electron donor is

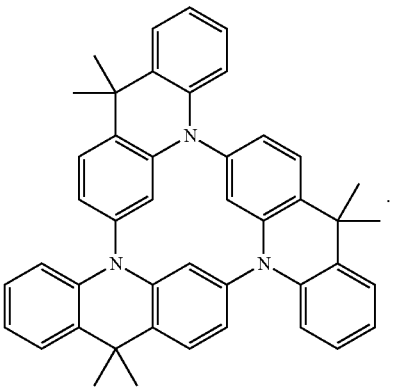 [SMILES: CC1(C)c2ccccc2N2c3ccc4c(c3)N(c3ccc5c(c3)N(c3ccc1c2c3)c1ccccc1C5(C)C)c1ccccc1C4(C)C]

Both of them are connected by a rigid hexatomic ring, which can effectively control the spectral width of the thermally activated delayed fluorescent material and improve the luminous efficiency of the thermally activated delayed fluorescent material.

The thermally activated delayed fluorescent material of an embodiment of the present disclosure connects the electron donor with the electron acceptor through a hexatomic ring, effectively controls the spectral width of the thermally activated delayed fluorescent material, and improves the luminous efficiency of the thermally activated delayed fluorescent material.

An embodiment of the present disclosure further provides a method of fabricating a thermally activated delayed fluorescent material, and the fabricating method is used to fabricate the above thermally activated delayed fluorescent material. Referring to FIG. 2, FIG. 2 is a flowchart of a method of fabricating a thermally activated delayed fluorescent material according to an embodiment of the present disclosure. The fabricating method comprises steps as follows.

In step S201, oxytetrahydrofuran, n-butyllithium, and a solution of boron bromide in diethyl ether are added in sequence into

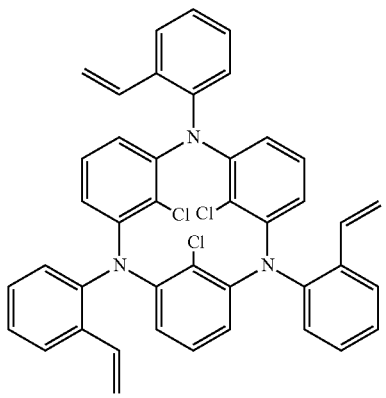 [SMILES: C=Cc1ccccc1N1c2cccc(c2Cl)N(c2ccccc2C=C)c2cccc(c2Cl)N(c2ccccc2C=C)c2cccc1c2Cl]

to react in a predetermined temperature range so as to obtain a first reaction solution.

The predetermined temperature range is between −75° C. and −80° C. In an embodiment, it can be set to −78° C. Specifically, at first,

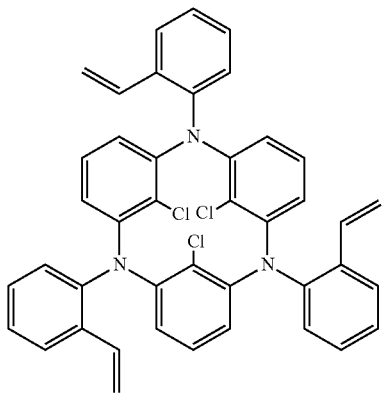 [SMILES: C=Cc1ccccc1N1c2cccc(c2Cl)N(c2ccccc2C=C)c2cccc(c2Cl)N(c2ccccc2C=C)c2cccc1c2Cl]

(6.85 g, 10 mmol) is added to a 100 ml two-necked flask and pumped three times. Further, 60 ml of oxytetrahydrofuran (THF) with water-free and oxygen-free is added thereto. Then, 15 ml of n-butyllithium (n-BuLi) having a molar concentration of 2 mol/L is added, and the reaction is carried out for 2 hours at a predetermined temperature range. Finally, 5 ml of a solution of boron bromide ($BBr_3$) in diethyl ether in a molar ratio of 2 mol/L is added thereto, and is reacted for 2 hours in the predetermined temperature range to obtain the first reaction solution.

In step S202, a reactant is added into the first reaction solution to obtain a third reaction solution.

The reactant may be meta-chloroperoxybenzoic acid (MCPBA) or a sulfur powder. Specifically, an excess of MCPBA or sulfur powder can be added to completely react the first reaction solution with MCPBA, or the first reaction solution may be completely reacted with sulfur to obtain a third reaction solution.

In step S203, the third reaction solution is purified to obtain a third solid to obtain a third solid.

After the third reaction solution is naturally warmed to room temperature, it is poured into 200 ml of water in a predetermined temperature range to precipitate a third solid. In an embodiment, the water in the predetermined temperature range can be water below 0° C. to increase an amount of precipitation of the third solid. Further, suction filtration is performed to a mixed solution of the third reaction solution and water to obtain a third solid, wherein the third solid is a grey-white solid. Further, column chromatography separation and purifying are performed by dissolving the third solid in dichloromethane and then adding silica gel and toluene thereto.

When the reactant is meta-chloroperoxybenzoic acid, 3.8 g of the third solid

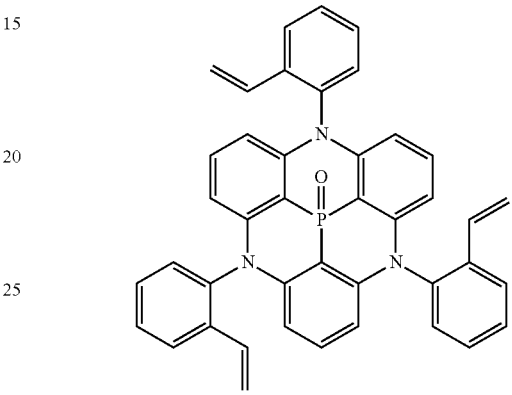

is obtained, which has a yield of 61%. A nuclear magnetic resonance spectrum of the third solid

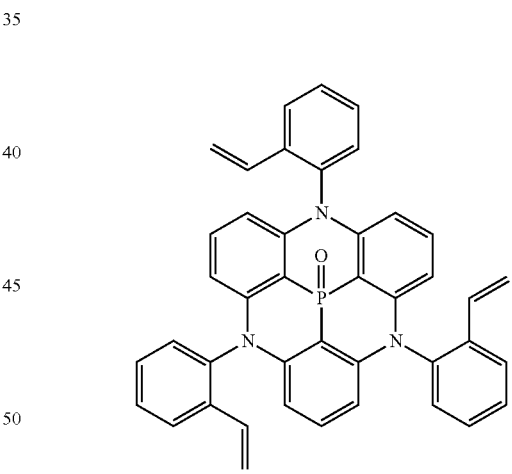

is characterized by $^1$H NMR (300 MHz, $CD_2Cl_2$, δ): 7.26 (d, J=6.3 Hz, 3H), 7.20-7.10 (m, 9H), 7.07-7.00 (m, 6H), 6.84 (d, J=6.6 Hz, 6H), 5.72 (d, J=6.0 Hz, 3H), 5.60 (d, J=6.0 Hz, 3H), and a mass spectrometry is characterized by MS (EI) m/z: [M]+ calcd for $C_{42}H_{30}ON_3P$, 623.21; found, 623.19. Anal. Calcd for $C_{42}H_{30}ON_3P$: C 80.88, H 4.85, N 6.74; found: C 80.76, H 4.77, N 6.69. It is noted that, a volume ratio of toluene to methylene chloride can be set to 1:2. 200-300 mesh powdery silica gel particles can be added as a stationary phase, and the third solid is dispersed in the silica gel to facilitate subsequent column chromatography separation.

When the reactant is sulfur powder, 3.2 g of the third solid

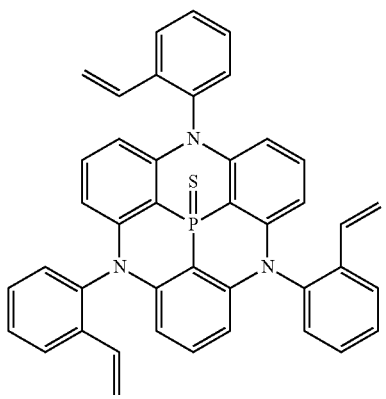

is obtained, which has a yield of 50%. A nuclear magnetic resonance spectrum of the third solid

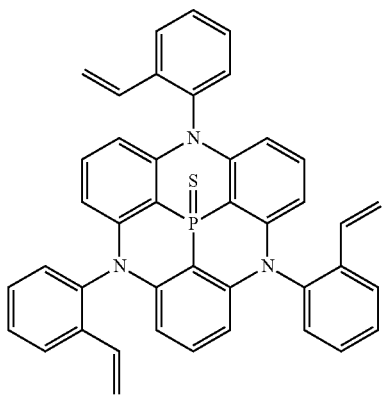

is characterized by $^1$H NMR (300 MHz, CD$_2$Cl$_2$, δ): 7.26 (d, J=6.3 Hz, 3H), 7.20-7.10 (m, 9H), 7.07-7.00 (m, 6H), 6.84 (d, J=6.6 Hz, 6H), 5.72 (d, J=6.0 Hz, 3H), 5.60 (d, J=6.0 Hz, 3H). A mass spectrometry is characterized by MS (EI) m/z: [M]+ calcd for C$_{42}$H$_{30}$N$_3$PS, 639.19; found, 639.12. Anal. Calcd for C$_{42}$H$_{30}$N$_3$PS: C 78.85, H 4.73, N 6.57; found: C 78.76, H 4.70, N 6.39. It is noted that, a volume ratio of toluene to methylene chloride can be set to 1:2. 200-300 mesh powdery silica gel particles can be added as a stationary phase, and the third solid is dispersed in the silica gel to facilitate subsequent column chromatography separation.

In step S204, a catalytic reaction is performed to the third solid in methane using a palladium carbon catalyst to obtain a fourth reaction solution.

Specifically, the third solid is added to a 100 ml reactor, and then a catalyst of palladium carbon is added thereto. A reaction is carried out for 2 hours at room temperature under a methane atmosphere to obtain a fourth reaction solution.

In step S104, the fourth reaction solution is filtered to obtain the thermally activated delayed fluorescent material.

Specifically, the above fourth reaction solution is poured into 50 ml of water below 0° C., and a compound in the aqueous phase is extracted three times with dichloromethane, and the dichloromethanes extracted three-times are combined. Further, column chromatography separation and purifying are performed by adding silica gel and toluene to obtain a thermally activated delayed fluorescent material.

In an embodiment, when the third solid is

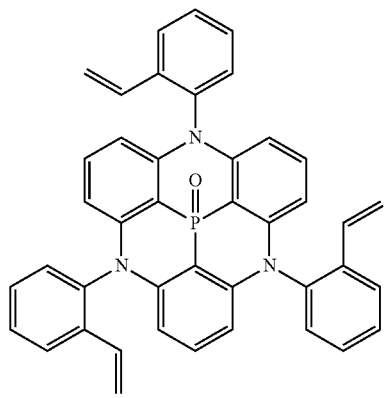

1.6 g of blue-white powdered thermally activated delayed fluorescent material

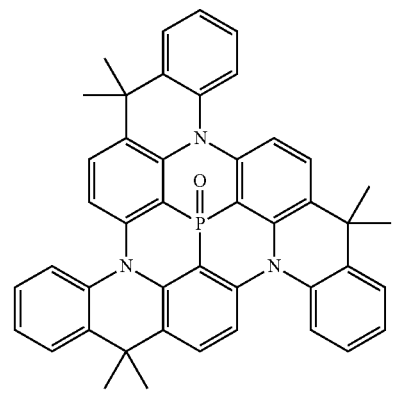

can be obtained, which has a yield of 60%. A nuclear magnetic resonance spectrum of the thermally activated delayed fluorescent material

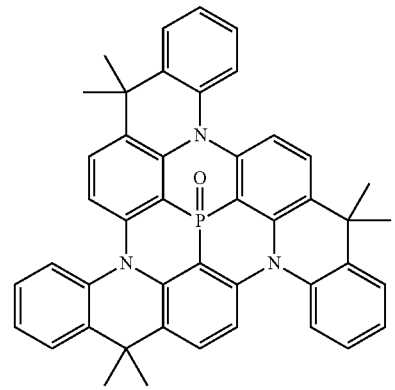

is characterized by $^1$H NMR (300 MHz, CD$_2$Cl$_2$, δ): 7.40 (d, J=6.0 Hz, 3H), 7.30 (d, J=6.3 Hz, 3H), 7.20-7.06 (m, 6H), 6.84 (d, J=6.6 Hz, 6H), 1.59 (s, 18H). A mass spectrometry is characterized by MS (EI) m/z: [M]+ calcd for C$_{45}$H$_{36}$N$_3$OP, 665.26; found, 665.21. Anal. Calcd for C$_{45}$H$_{36}$N$_3$OP: C 81.18, H 5.45, N 6.31; found: C 81.01, H 5.37, N 6.19.

In an embodiment, when the third solid is

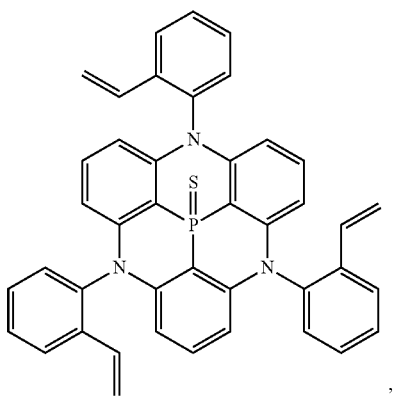

1.3 g of blue-white powdered thermally activated delayed fluorescent material

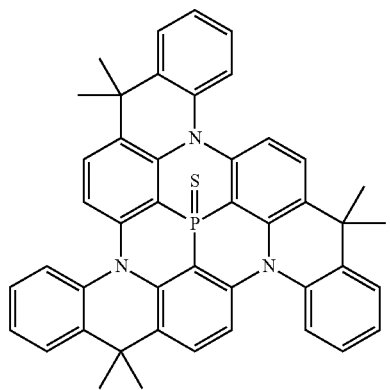

can be obtained, which has a yield of 48%. A nuclear magnetic resonance spectrum of the thermally activated delayed fluorescent material

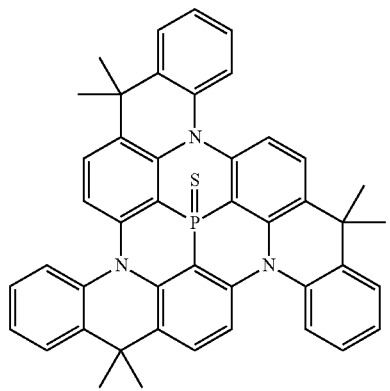

is characterized by $^1$H NMR (300 MHz, CD$_2$Cl$_2$, δ): 7.40 (d, J=6.0 Hz, 3H), 7.30 (d, J=6.3 Hz, 3H), 7.20-7.06 (m, 6H), 6.84 (d, J=6.6 Hz, 6H), 1.59 (s, 18H), and a mass spectrometry is characterized by MS (EI) m/z: [M]+ calcd for C$_{45}$H$_{36}$N$_3$PS, 681.24; found, 681.21. Anal. Calcd for C$_{45}$H$_{36}$N$_3$PS: C 79.27, H 5.32, N 6.16; found: C 79.01, H 5.17, N 6.03.

The thermally activated delayed fluorescent material of an embodiment of the present disclosure connects the electron donor with the electron acceptor through a hexatomic ring, effectively controls the spectral width of the thermally activated delayed fluorescent material, and improves the luminous efficiency of the thermally activated delayed fluorescent material.

Figure 4:
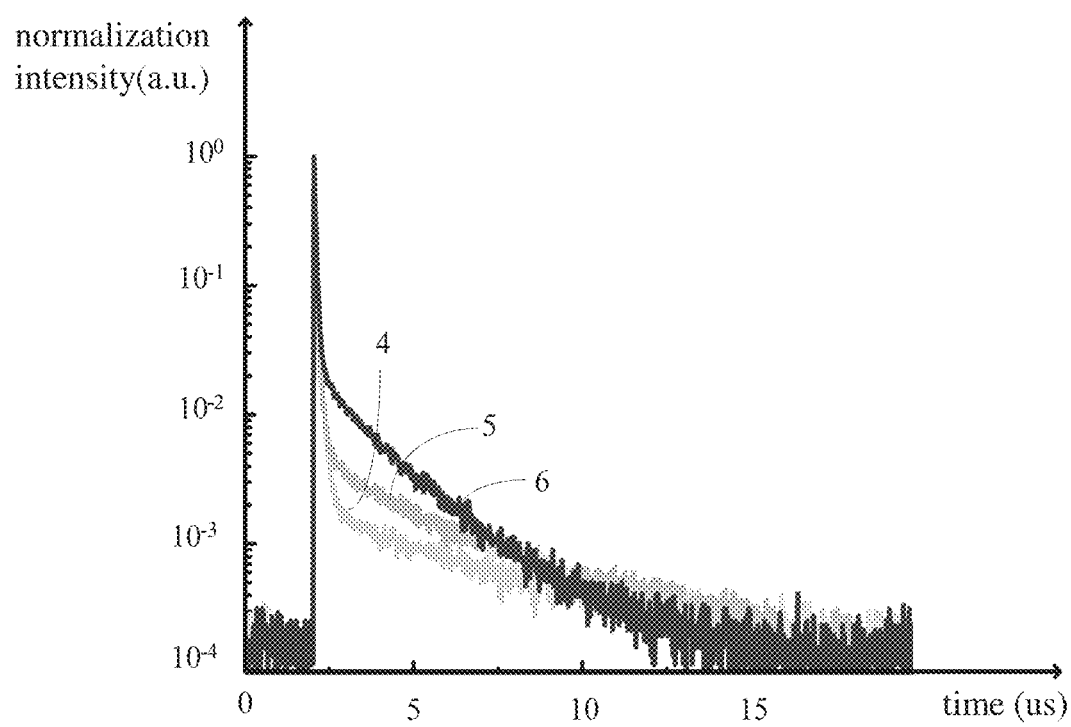
FIG. 4 is a transient photoluminescence spectrum of a thermally activated delayed fluorescent material in a toluene solution according to an embodiment of the present disclosure.
Figure 5:
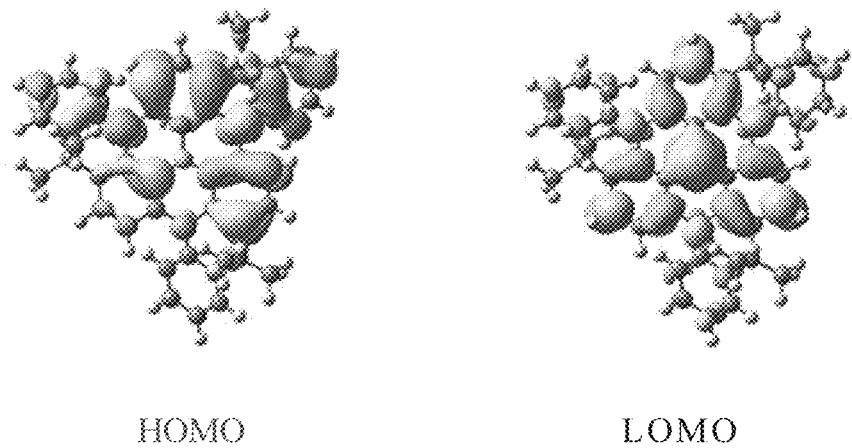
FIG. 5 is a distribution diagram of highest occupied molecular orbital (HOMO) and lowest unoccupied molecular orbital (LUMO) of a thermally activated delayed fluorescent material according to an embodiment of the present disclosure.
Figure 6:
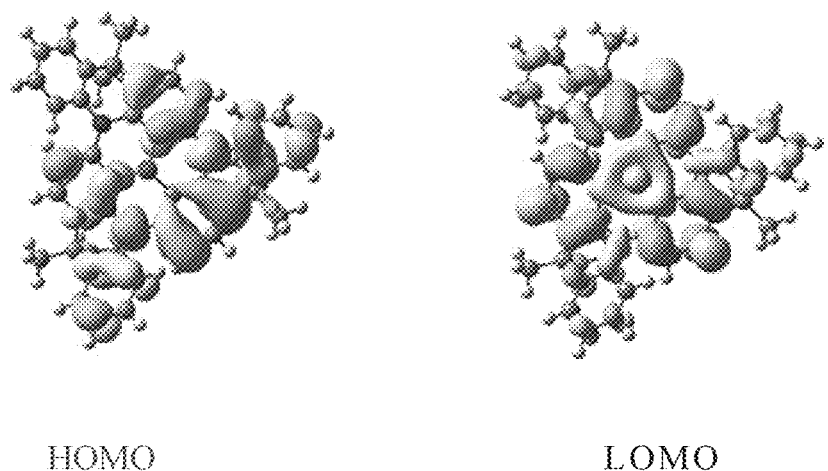
FIG. 6 is a distribution diagram of HOMO and LUMO of another thermally activated delayed fluorescent material according to an embodiment of the present disclosure.

Referring to FIG. 3 to FIG. 7, relating properties of the thermally activated delayed fluorescent material provided by the embodiments of the present disclosure are further analyzed. FIG. 3 is a photoluminescence spectrum of a thermally activated delayed fluorescent material in a toluene solution according to the present embodiment. FIG. 4 is a transient photoluminescence spectrum of a thermally activated delayed fluorescent material in a toluene solution according to the present embodiment. FIG. 5 to FIG. 7 are distribution diagrams of highest occupied molecular orbital (HOMO) and lowest unoccupied molecular orbital (LUMO) of a thermally activated delayed fluorescent material according to an embodiment of the present disclosure.

As shown in FIG. 3, curve 1 is a photoluminescence spectrum of the thermally activated delayed fluorescent material

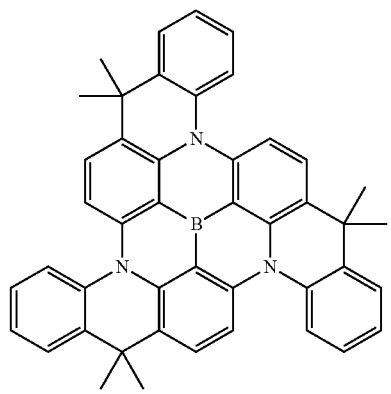

in toluene solution. As can be seen from Table 1 and FIG. 3, the thermally activated delayed fluorescent material

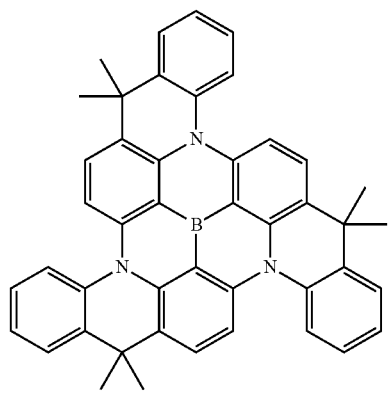 [SMILES: CC1(C)c2ccccc2N2c3ccc4c5c3B3c6c(ccc1c62)N1c2ccccc2C(C)(C)c2ccc(c3c21)N5c1ccccc1C4(C)C]

has highest fluorescence normalization intensity at the 420 nm peak (PL peak). As shown in FIG. 4, curve 4 is a photoluminescence spectrum of the thermally activated delayed fluorescent material

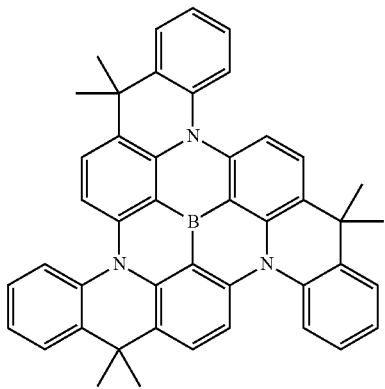

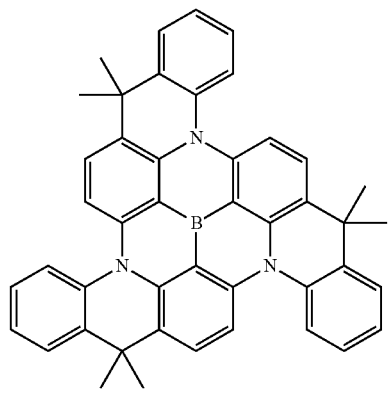 [SMILES: CC1(C)c2ccccc2N2c3ccc4c5c3B3c6c(ccc1c62)N1c2ccccc2C(C)(C)c2ccc(c3c21)N5c1ccccc1C4(C)C]

in the toluene solution.

The thermal activation delayed fluorescence material has a lowest singlet energy level $S_1$ of 2.95 eV, and a lowest triplet energy level $T_1$ of 2.81, and a difference value between both of them is 0.14.

As shown in FIG. 3, curve 2 is a photoluminescence spectrum of the thermally activated delayed fluorescent material

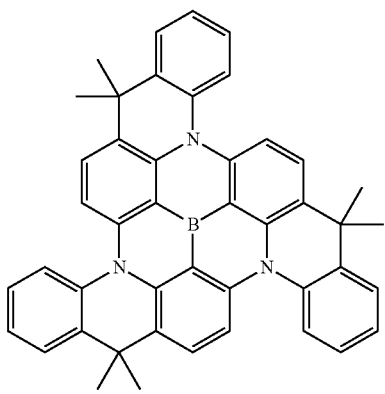

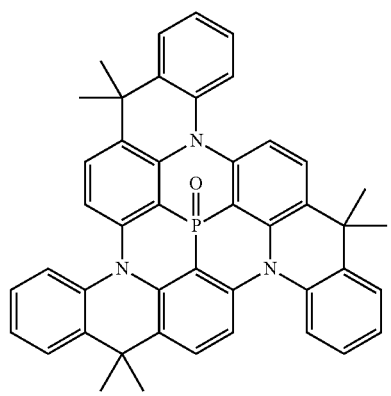

has highest fluorescence normalization intensity at 2.5 us. As can be seen from FIG. 5 and FIG. 3, the thermal activation delayed fluorescence material in the toluene solution. As can be seen from Table 1 and FIG. 3, the thermally activated delayed fluorescent material

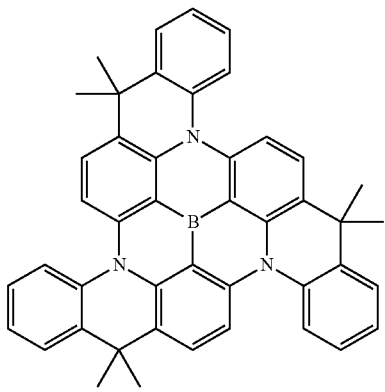 [SMILES: CC1(C)c2ccccc2N2c3ccc4c5c3B3c6c(ccc1c62)N1c2ccccc2C(C)(C)c2ccc(c3c21)N5c1ccccc1C4(C)C]

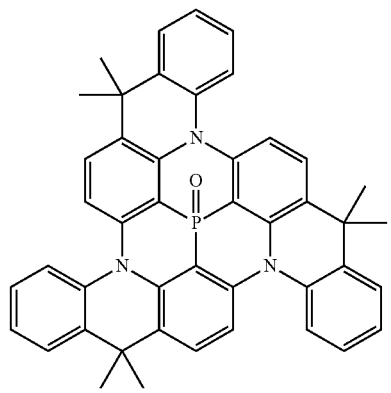

has a HOMO of −5.31 eV, and a LUMO of −2.13 eV. As shown in Table 1, the thermal activation delayed fluorescence material has highest fluorescence normalization intensity at the 422 nm peak (PL peak). As shown in FIG. 4, curve 5 is a photoluminescence spectrum of the thermally activated delayed fluorescent material

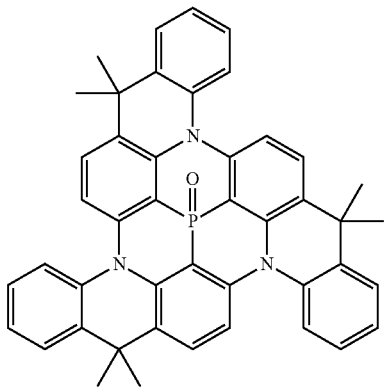

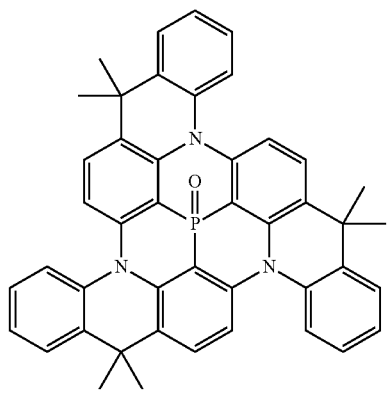

in toluene solution. The thermal activation delayed fluorescence material

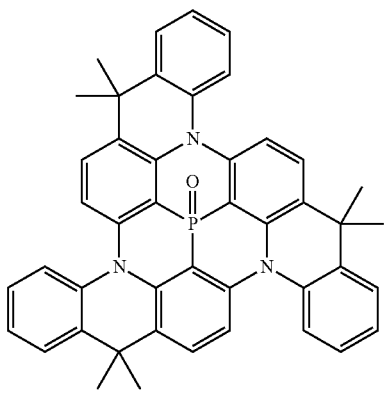

has highest fluorescence normalization intensity at 2.5 us. As can be seen from FIG. 6 and FIG. 3, the thermal activation delayed fluorescence material

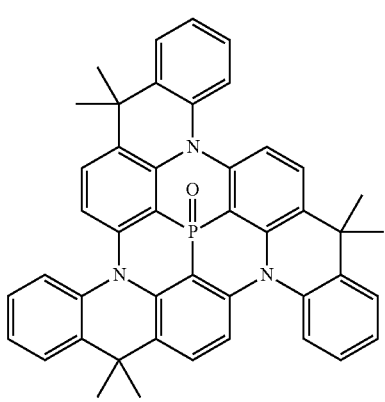

has a HOMO of −5.42 eV, and a LUMO of −2.14 eV. As shown in Table 1, the thermal activation delayed fluorescence material has a lowest singlet energy level $S_1$ of 2.94 eV, and a lowest triplet energy level $T_1$ of 2.80, and a difference value between both of them is 0.14.

As shown in FIG. 3, curve 3 is a photoluminescence spectrum of the thermally activated delayed fluorescent material

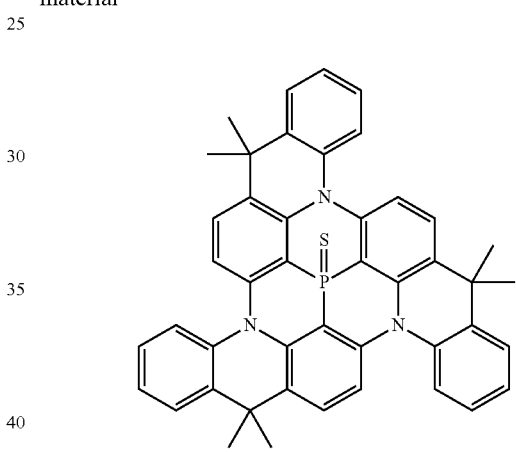

in the toluene solution. As can be seen from Table 1 and FIG. 3, the thermally activated delayed fluorescent material

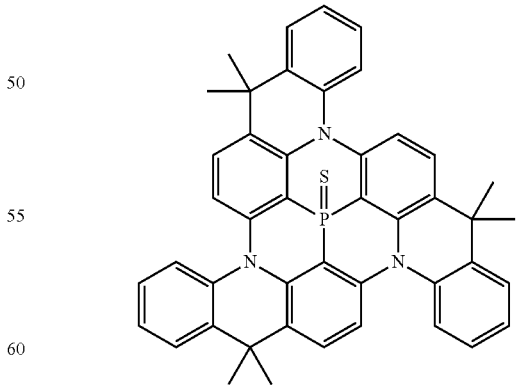

has highest fluorescence normalization intensity at the 423 nm peak (PL peak). As shown in FIG. 4, curve 6 is a photoluminescence spectrum of the thermally activated delayed fluorescent material

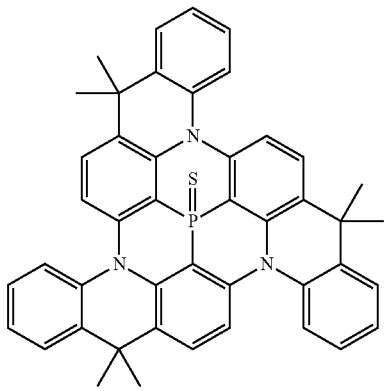

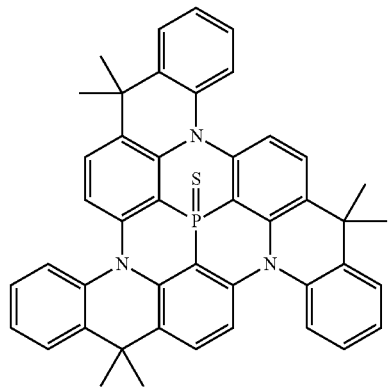

in the toluene solution.

The thermal activation delayed fluorescence material

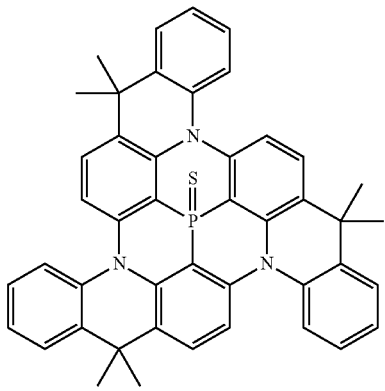

has highest fluorescence normalization intensity at 2.5 us. As can be seen from FIG. 7 and FIG. 3, the thermal activation delayed fluorescence material has a HOMO of −5.42 eV, and a LUMO of −2.13 eV. As shown in Table 1, the thermal activation delayed fluorescence material

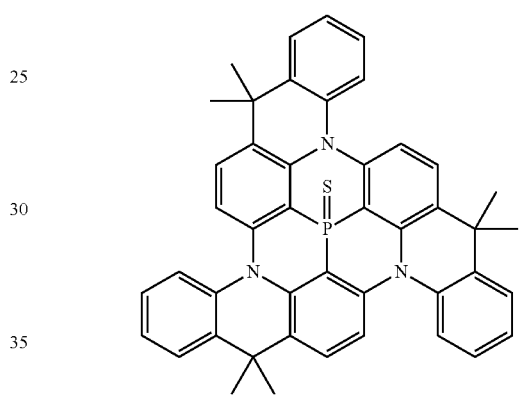

has a lowest singlet energy level $S_1$ of 2.93 eV, and a lowest triplet energy level $T_1$ of 2.77, and a difference value between both of them is 0.16.

TABLE 1

| PL Peak (nm) | S1 (eV) | T1 (eV) | EST (eV) | HOMO (eV) | LUMO (eV) |
|---|---|---|---|---|---|
| 420 | 2.95 | 2.81 | 0.14 | −5.31 | −2.13 |

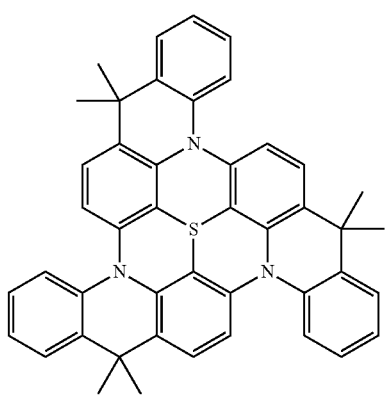

TABLE 1-continued

| | PL Peak (nm) | S1 (eV) | T1 (eV) | EST (eV) | HOMO (eV) | LUMO (eV) |
|---|---|---|---|---|---|---|
| [structure with P=O] | 422 | 2.94 | 2.80 | 0.14 | −5.42 | −2.14 |
| [structure with P=S] | 423 | 2.93 | 2.77 | 0.16 | −5.42 | −2.13 |

The electron donor and the electron acceptor in the above thermally activated delayed fluorescent material are all connected by a rigid hexatomic ring and stability is good. The spectral width can be effectively controlled to achieve a narrow spectrum.

An embodiment of the present disclosure further provides an electroluminescent device. Referring to FIG. 8, FIG. 8 is a schematic structural diagram of an electroluminescent device according to an embodiment of the present disclosure. The electroluminescent device 10 includes a substrate layer 11; an anode layer 12, a hole transporting layer 13, a luminescent layer 14, an electron transporting layer 15, and a cathode layer 16 disposed in sequence.

The substrate 11 can be made of a flexible material or a rigid material. Specifically, the substrate 11 includes a glass substrate.

The anode layer 12 can be fabricated by coating the substrate 11 with an indium tin oxide layer. The anode layer 12 is used to provide holes.

The hole transporting layer 13 is used for transporting holes provided by the anode layer 12 to the luminescent layer 14. The hole transporting layer 13 can be fabricated using poly 3,4-ethylenedioxythiophene:polystyrene sulfonate (PEDOT:PSS). A thickness of the hole transporting layer 13 can be set to 40 to 60 nm, and in one embodiment, the hole transporting layer 13 can be set to 50 nm.

The cathode layer 16 is used to provide electrons. The cathode layer 16 can be fabricated using a low work function metal material such as one or more of lithium, magnesium, calcium, aluminum, lithium fluoride, and the like. A thickness of the cathode layer 16 can be set to be between 80 and 120 nm. In one embodiment, the thickness of the cathode layer 16 can be set to 100 nm.

The electron transporting layer 15 is used to transport electrons provided by the cathode layer 16 to the luminescent layer 14. The electron transporting layer 15 can be fabricated by 1,3,5-tris(3-(3-pyridyl)phenyl)benzene (Tm3PyPB). A thickness of the electron transporting layer 15 can be set to be between 30 and 50 nm. In one embodiment, the thickness of the electron transporting layer 15 can be set to 40 nm.

The luminescent layer 14 comprises the above-mentioned thermally activated delayed fluorescent material, and the electron donor and the electron acceptor of the thermally activated delayed fluorescent material are connected by a hexatomic ring, which can effectively control the spectral width of the thermally activated delayed fluorescent material and improve the luminous efficiency of the thermally activated delayed fluorescent material.

In some embodiments, a molecular structural formula of the thermally activated delayed fluorescent material is

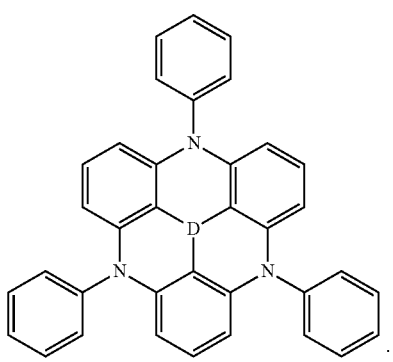

An electron donor of

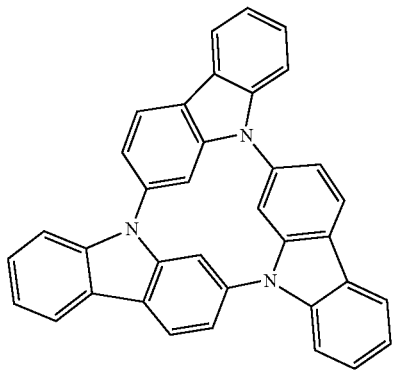 [SMILES: c1ccc2c(c1)c1ccc3cc1n2c1ccc2c4ccccc4n(c4ccc5c6ccccc6n3c5c4)c2c1]

and an electron acceptor D of the thermally activated delayed fluorescent material are connected with each other by a hexatomic ring, wherein D is

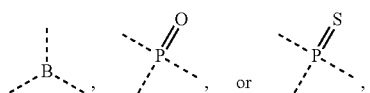

i.e., the thermally activated delayed fluorescent material comprises

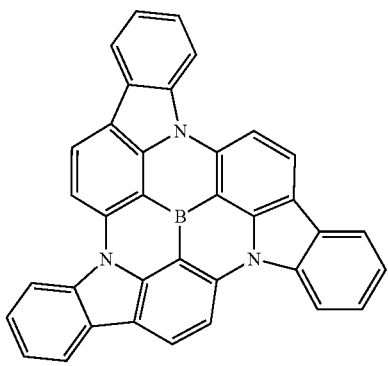

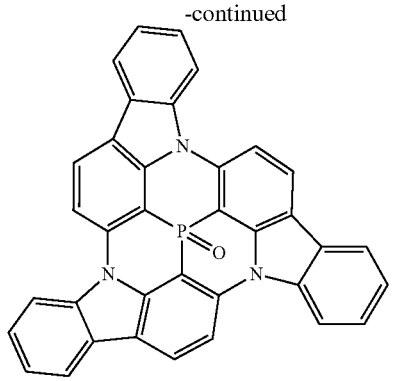

, and

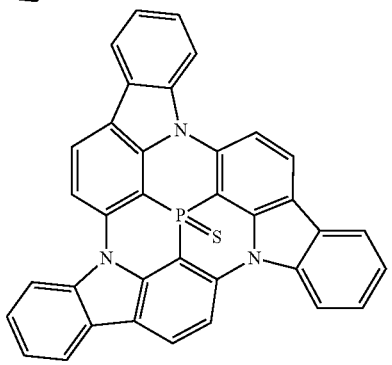

In an embodiment, a molecular structural formula of the thermally activated delayed fluorescent material is

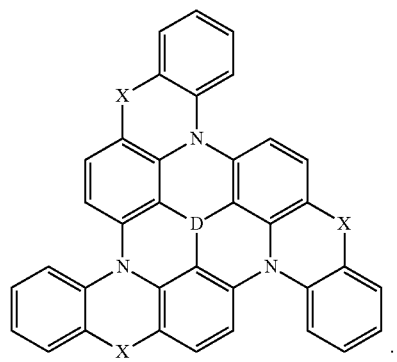

An electron donor of

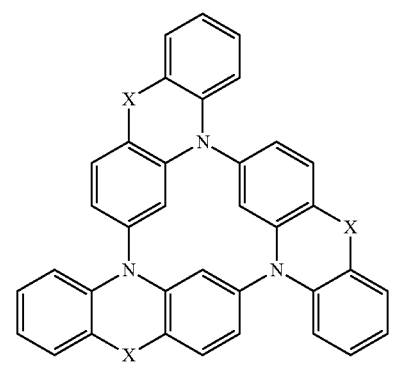

and an electron acceptor D of the thermally activated delayed fluorescent material are connected with each other by a hexatomic ring, wherein D is
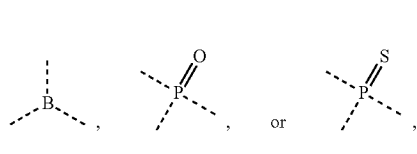
and X is C(CH$_3$)$_2$, 2H, S, or O, i.e., the thermally activated delayed fluorescent material includes
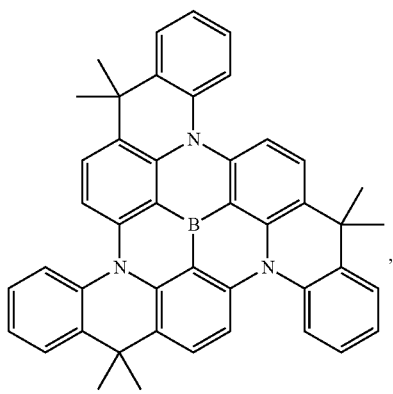
,
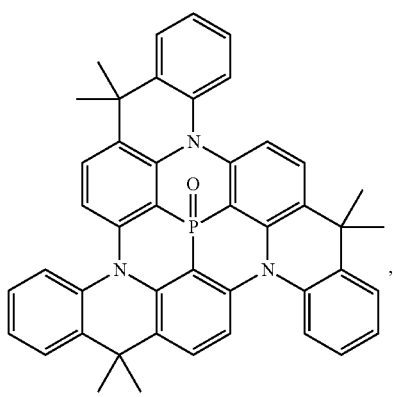
,
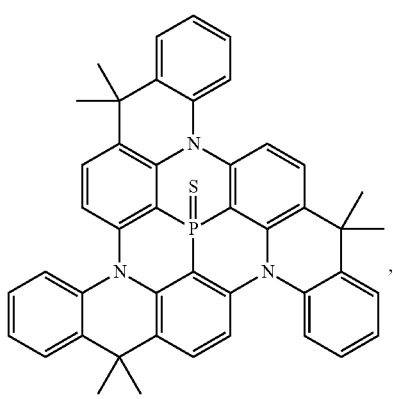
,
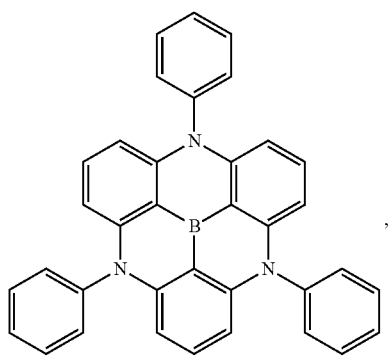
,
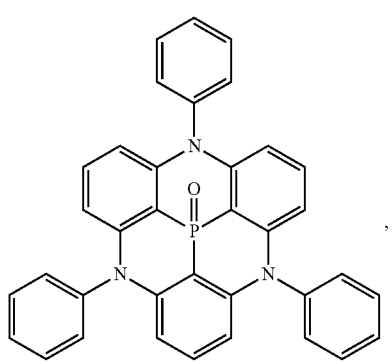
,
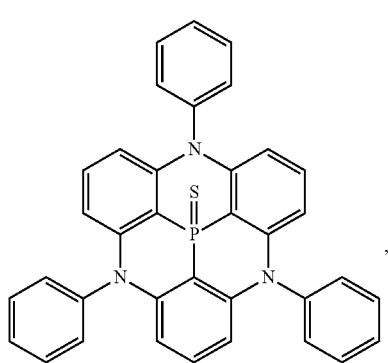
,
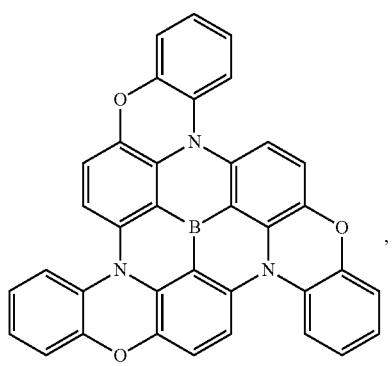
,

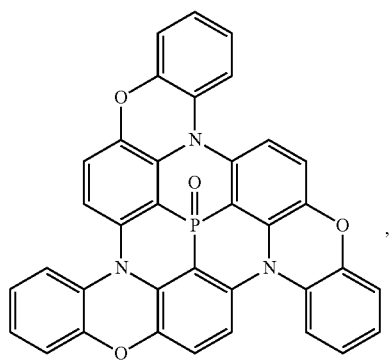,

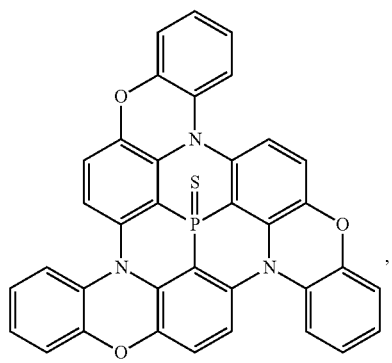,

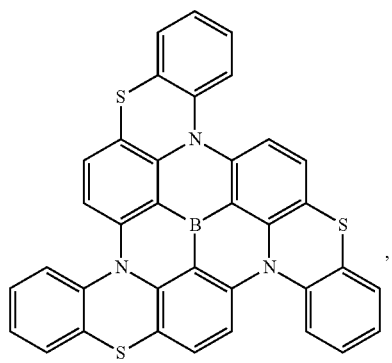,

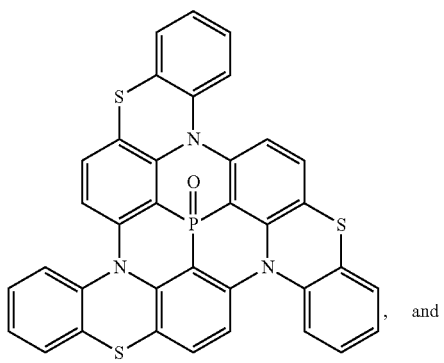 and

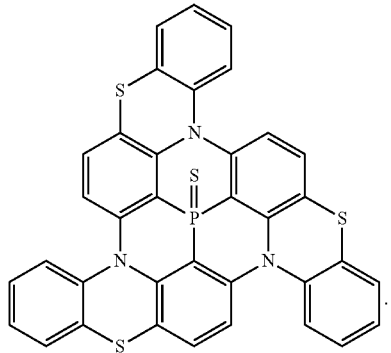.

Specifically, the luminescent layer 14 can include DPEPO and the above thermally activated delayed fluorescent material. A proportion of the thermally activated delayed fluorescent material in the luminescent layer 14 can be between 3% and 7%. In one embodiment, the proportion of the thermally activated delayed fluorescent material can be 5%. A thickness of the luminescent layer 14 can be set to be between 30 and 50 nm. In an embodiment, the thickness of the luminescent layer 14 can be set to 40 nm.

The holes and the electrons recombine in the luminescent layer 14 to generate excitons. The thermally activated delayed fluorescent material emits light under the effects of excitons.

As shown in Table 2 below, when the thermally activated delayed fluorescent material

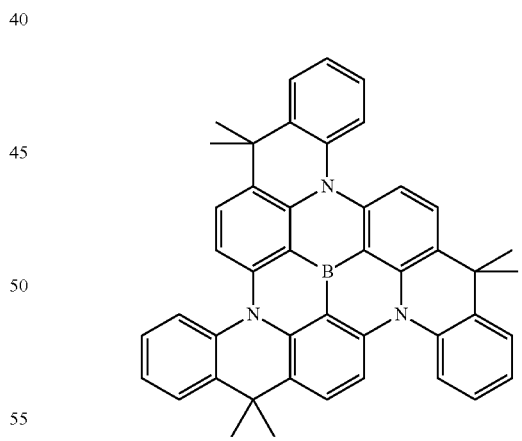

is used to fabricate the electroluminescent device 1, maximum brightness of the device 1 is 1567 cd/m², the highest current efficiency is 17.4 cd/A, a response of the human eye to the brightness (CIEy) is 0.08, and a maximum external quantum efficiency is 16.3%.

When the thermally activated delayed fluorescent material

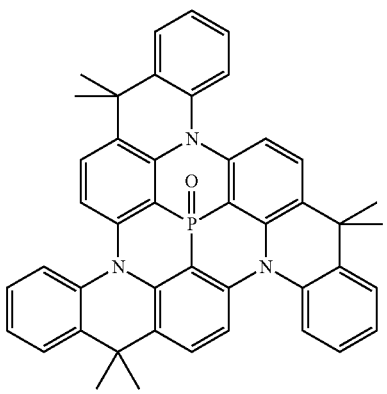

is used to fabricate the electroluminescent device 2, maximum brightness of the device 2 is 1354 cd/m², highest current efficiency is 18.3 cd/A, a response of the human eye to the brightness (CIEy) is 0.09, and maximum external quantum efficiency is 17.1%.

When the thermally activated delayed fluorescent material

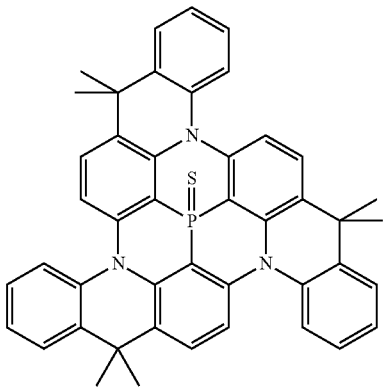

is used to fabricate the electroluminescent device 3, maximum brightness of the device 3 is 1087 cd/m², highest current efficiency is 16.5 cd/A, a response of the human eye to the brightness (CIEy) is 0.09, and maximum external quantum efficiency is 15.5%.

TABLE 2

| device | maximum brightness (cd/m2) | highest current efficiency (cd/A) | CIEy | maximum external quantum efficiency (%) |
|---|---|---|---|---|
| device 1 | 1567 | 17.4 | 0.08 | 16.3 |
| device 2 | 1354 | 18.3 | 0.09 | 17.1 |
| device 3 | 1087 | 16.5 | 0.09 | 15.5 |

In the electroluminescent device of the embodiment of the present disclosure, the electron donor and the electron acceptor in the thermally activated delayed fluorescent material in the luminescent layer is connected by a rigid hexatomic ring, which can effectively control the spectral width of the thermally activated delayed fluorescent material and improve the luminous efficiency of the thermally activated delayed fluorescent material.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. An electroluminescent device, comprising: a substrate layer; and anode layer, a luminescent layer, and a cathode layer, wherein the luminescent layer comprises a thermally activated delayed fluorescent material, comprising a molecular structural formula of

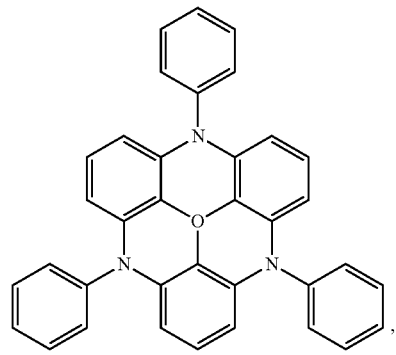

and an electron donor and an electron acceptor of the thermally activated delayed fluorescent material are connected with each other by a hexatomic ring, wherein D is the electron acceptor and is

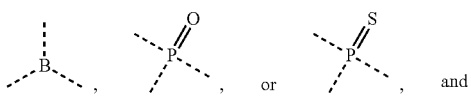

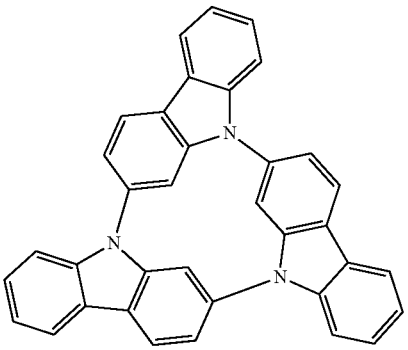

is the electron donor.

2. A method of fabricating a thermally activated delayed fluorescent material, comprising steps of:

adding oxytetrahydrofuran, n-butyllithium, and a solution of boron bromide in diethyl ether in sequence into

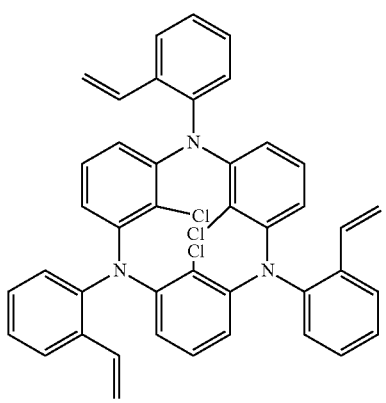 [SMILES: C=Cc1ccccc1N1c2cccc(c2Cl)N(c2ccccc2C=C)c2cccc(c2Cl)N(c2ccccc2C=C)c2cccc1c2Cl]

to react in a predetermined temperature range so as to obtain a first reaction solution, wherein the predetermined temperature range is between −75° C. and −80° C.;

purifying the first reaction solution to obtain a first solid;

performing a catalytic reaction to the first solid in methane using a palladium carbon catalyst to obtain a second reaction solution; and filtering the second reaction solution to obtain the thermally activated delayed fluorescent material.

3. The method of fabricating the thermally activated delayed fluorescent material according to claim 2, wherein the step of purifying the first reaction solution to obtain the first solid comprises steps of:

mixing the first reaction solution with water in the predetermined temperature range to obtain the second solid; and dissolving the second solid in dichloromethane to obtain a mixture, and adding silica gel and toluene into the mixture for purifying so as to obtain the first solid.

4. The method of fabricating the thermally activated delayed fluorescent material according to claim 3, wherein the first solid is

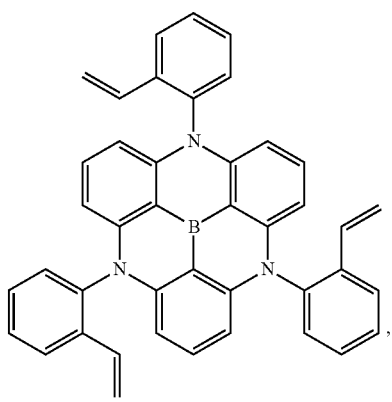 [SMILES: C=Cc1ccccc1N1c2cccc3c2B2c4c1cccc4N(c1ccccc1C=C)c1cccc(c12)N3c1ccccc1C=C]

and the thermally activated delayed fluorescent material is

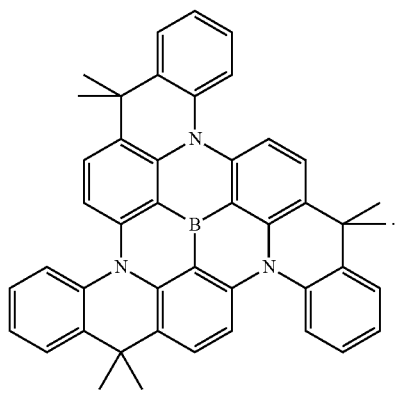 [SMILES: CC1(C)c2ccccc2N2c3ccc4c5c3B3c6c(ccc1c62)N1c2ccccc2C(C)(C)c2ccc(c3c21)N5c1ccccc1C4(C)C]

5. A method of fabricating a thermally activated delayed fluorescent material, comprising steps of:

adding oxytetrahydrofuran, n-butyllithium, and a solution of boron bromide in diethyl ether in sequence into

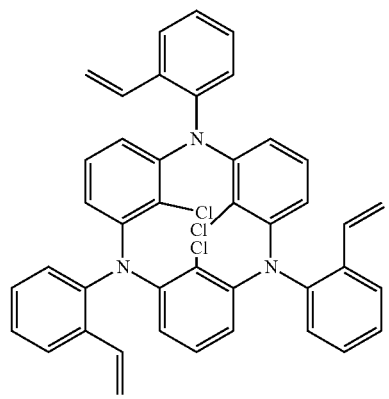 [SMILES: C=Cc1ccccc1N1c2cccc(c2Cl)N(c2ccccc2C=C)c2cccc(c2Cl)N(c2ccccc2C=C)c2cccc1c2Cl]

to react in a predetermined temperature range so as to obtain a first reaction solution, wherein the predetermined temperature range is between −75° C. and −80° C.;

adding a reactant into the first reaction solution to obtain a third reaction solution;

purifying the third reaction solution to obtain a third solid;

performing a catalytic reaction to the third solid in methane using a palladium carbon catalyst to obtain a fourth reaction solution; and filtering the fourth reaction solution to obtain the thermally activated delayed fluorescent material.

6. The method of fabricating the thermally activated delayed fluorescent material according to claim 5, wherein the reactant is meta-chloroperoxybenzoic acid, the third solid is

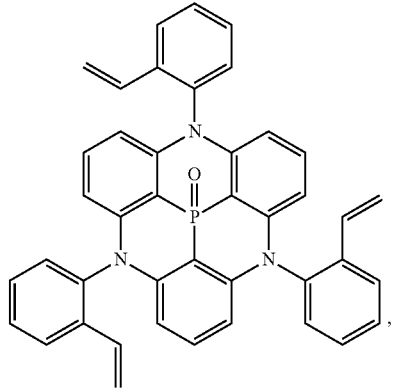

and the thermally activated delayed fluorescent material is

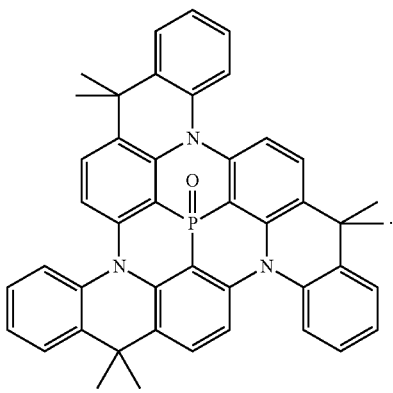

7. The method of fabricating the thermally activated delayed fluorescent material according to claim 5, wherein the reactant is sulfur powder, the third solid is

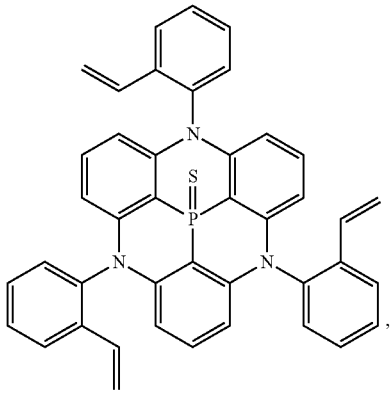

and the thermally activated delayed fluorescent material is

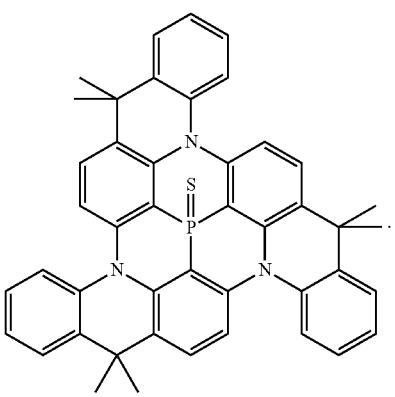

8. The electroluminescent device according to claim 1, comprising: the substrate layer; the anode layer, hole transporting layer, the luminescent layer, an electron transporting layer, and the cathode layer disposed in sequence, wherein the anode layer is used to provide holes; wherein the hole transporting layer is used to transport the holes to the luminescent layer; wherein the cathode layer is used to provide electrons; wherein the electron transporting layer is used to transport the electrons to the luminescent layer; and wherein the luminescent layer is used to recombine the holes and the electrons to generate excitons, and cause the thermally activated delayed fluorescent material to emit light under an effect of the excitons.

* * * * *